US006960926B2

United States Patent
Anderson et al.

(10) Patent No.: US 6,960,926 B2
(45) Date of Patent: Nov. 1, 2005

(54) METHOD AND APPARATUS FOR CHARACTERIZING A CIRCUIT WITH MULTIPLE INPUTS

(75) Inventors: Carl J. Anderson, Austin, TX (US); Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 522 days.

(21) Appl. No.: 10/178,883

(22) Filed: Jun. 24, 2002

(65) Prior Publication Data

US 2003/0237029 A1 Dec. 25, 2003

(51) Int. Cl.[7] ............................................... G01R 31/26
(52) U.S. Cl. ...................... 324/766; 324/617; 324/105; 702/709; 716/6
(58) Field of Search ............................... 324/105, 617, 324/766; 702/79; 716/6

(56) References Cited

U.S. PATENT DOCUMENTS 6,111,436 A * 8/2000 Molnar ........................ 327/19

6,442,740 B1 * 8/2002 Kanamoto et al. ............. 716/6

FOREIGN PATENT DOCUMENTS

EP              645638 A1 * 3/1995 ........... G01R/31/28

* cited by examiner

Primary Examiner—R. Stephen Dildine
(74) Attorney, Agent, or Firm—Ryan, Mason & Lewis, LLP

(57) ABSTRACT

A method of characterizing a circuit comprises the steps of measuring a first delay associated with the circuit when the circuit is substantially unloaded; measuring a second delay associated with the circuit when the circuit is loaded by a predetermined impedance; determining a difference between the second delay and the first delay, the delay difference corresponding to a switching impedance associated with the circuit; and determining a characterization parameter of the circuit, the characterization parameter being a function of at least the switching impedance associated with the circuit. The methodologies of the present invention are directed primarily to individually evaluating pullup and pulldown delays with substantial precision (e.g., sub-picosecond) for a representative set of circuits in the presence of an arbitrary switching history.

26 Claims, 4 Drawing Sheets

METHOD AND APPARATUS FOR CHARACTERIZING A CIRCUIT WITH MULTIPLE INPUTS

FIELD OF THE INVENTION

The present invention relates generally to test and measurement of devices and circuits, and more particularly relates to techniques for characterizing a circuit having multiple inputs.

BACKGROUND OF THE INVENTION

The high speed performance of a digital logic gate is commonly characterized using circuits such as ring oscillators, delay chains and the like. In these circuits, the time T for a signal to propagate through some number n of identical gates is measured and the delay per stage is typically determined as T/n. Such measurements, however, do not allow the independent measurement of pullup and pulldown performance, but instead yield an average of the pullup and pulldown delays associated with the logic gates. Furthermore, using conventional measurement methodologies, input and output slews are undesirably fixed by the condition that all gates drive and are driven by gates nominally identical to themselves. Each gate generally has a single input that is toggled, and that selection is hardwired in place at the time of layout.

In circuits fabricated using a partially depleted Silicon-On-Insulator (SOI) process, circuit delay is typically a function of switching history of the circuits. This switching history dependence can significantly complicate the design of such circuits. History is generally determined as a tradeoff among the effects of drain-to-body and source-to-body leakage currents (long time constants) and very rapid dynamic capacitive coupling effects. The presence of gate-to-body tunneling further complicates the device design.

Conventionally, experiments performed to evaluate history effects are generally delay chain experiments, in which steady state delays are measured and compared with delays for different input patterns. Such experiments, however, have not agreed particularly well with model predictions. One shortcoming of these traditional approaches is that they only allow a single specific switching pattern, such as, for example, all top-switching four-way NAND gates, or all bottom-switching four-way NAND gates. More complex switching patterns in which the order of logic gate input switching varies over time, are not possible using conventional methodologies.

SUMMARY OF THE INVENTION

The present invention provides techniques for characterizing the performance of a device or circuit having multiple inputs. The methodologies of the present invention are directed primarily to individually evaluating pullup and pulldown delays with substantial precision (e.g., sub-picosecond) for a representative set of circuits in the presence of an arbitrary switching history.

In accordance with one aspect of the invention, a method of characterizing a circuit comprises the steps of measuring a first delay associated with the circuit when the circuit is substantially unloaded; measuring a second delay associated with the circuit when the circuit is loaded by a predetermined impedance; determining a difference between the second delay and the first delay, the delay difference corresponding to a switching impedance associated with the circuit; and determining a characterization parameter of the circuit, the characterization parameter being a function of at least the switching impedance associated with the circuit.

In accordance with another aspect of the invention, a technique for determining a thermal relaxation time of a circuit includes the steps of measuring a first reference delay difference associated with the circuit at a first steady-state temperature, the delay difference corresponding to a difference between a first delay associated with the circuit when the circuit is substantially unloaded and a second delay associated with the circuit when the circuit is loaded by a predetermined impedance; heating at least a portion of the circuit for a period of time to establish a thermal steady-state condition of the circuit at a second steady-state temperature, the second steady-state temperature being greater than the first steady-state temperature; measuring a second reference delay difference associated with the circuit at the second steady-state temperature; and determining an amount of time elapsed after heating has ceased for a measured delay difference associated with the circuit to substantially match the first reference delay difference, the amount of elapsed time corresponding to the thermal relaxation time of the circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein with reference to circuits that are fabricated using a partially depleted silicon-on-insulator (SOI) process. As previously stated, modeling SOI devices and circuits is particularly difficult due, at least in part, to a body potential which may vary as a function of switching history. This body potential is created in part as a result of the floating body which is present in the SOI circuit. It is to be appreciated, however, that the techniques of the present invention are not limited to SOI circuits. Rather, the techniques of the invention may be similarly used to more accurately model and characterize devices and circuits formed using alternative fabrication processes, such as, but not limited to, a conventional bulk CMOS process.

Figure 1:
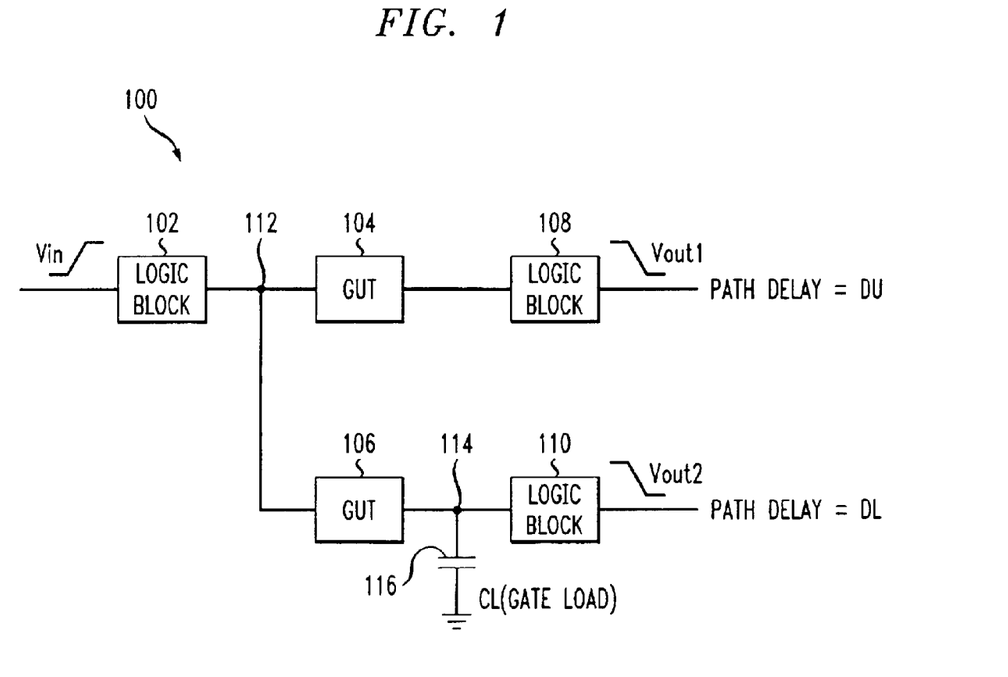
FIG. 1 is a block diagram illustrating a system for characterizing a particular circuit under test, in accordance with one aspect of the present invention.

FIG. 1 shows an exemplary characterization circuit 100 illustrating the methodologies of the present invention. As apparent from the figure, an input signal Vin, which may be generated from an external voltage source, is preferably presented to a logic block 102, or alternative interface, that preconditions the input signal before presenting it in parallel to two substantially identical gates under test (GUTs) 104 and 106 at node 112. It is to be appreciated that GUTs 104, 106 may alternatively be circuits under test. A first signal path preferably comprises GUT 104 coupled to a logic block 108. The first signal path is substantially unloaded and generates an output signal Vout1 having an unloaded delay DU associated therewith measured at an output of logic block 108 with respect to the input signal Vin. Likewise, a second signal path preferably comprises GUT 106 coupled to a logic block 110, which is substantially identical to logic block 108, and a known capacitive load 116, having a capacitance CL associated therewith, coupled between an output of GUT 106 at node 114 and a voltage reference, which may be ground. The second signal path is therefore loaded and generates an output signal Vout2 having a loaded delay DL associated therewith measured at an output of logic block 110 with respect to the input signal Vin. The capacitive load 116 may be a large metal-oxide capacitor, a gate load capacitance device, or a suitable alternative device for providing a predefined, or otherwise controllable, capacitive load, as will be appreciated by those skilled in the art. Furthermore, the second signal path may be loaded by any known impedance and is not limited to capacitive loading.

Using measurement equipment, such as, for example, a conventional sampling oscilloscope, a time delay between the input signal Vin and a corresponding output signal Vout1, Vout2 generated by the unloaded signal path and the loaded signal path, respectively, can be determined. The difference in delay between the two signal paths, defined herein as ΔD, may be determined as ΔD=DL−DU. The unloaded delay DU is dominated by the expression Rsw·CL, where Rsw is the switching resistance associated with the GUT. One polarity transition of the input signal Vin (e.g., rising or falling edge) will yield the characteristic switching resistance of a pullup device associated with the GUT, namely, Rsw(PU), while an opposite polarity for Vin will yield a characteristic switching resistance of a pulldown device associated with the GUT, namely, Rsw(PD).

A knowledge of the switching resistance corresponding to the GUT can be used to determine a drive capability for the pullup device (e.g., p-type field effect transistor (PFET) in an output stage of the GUT) and the pulldown device (e.g., n-type field effect transistor (NFET) in the output stage of the GUT) associated with the GUT. In general, the delay of a gate can be expressed as Rsw·CT, where CT is the total capacitance to be driven. Total capacitance CT can be extracted from other measurements, such as, for example, the current drawn during a given switching event for a known power supply voltage, which may be VDD.

It is to be appreciated that, although two independent signal paths are shown in the exemplary characterization circuit 100, the first signal path being substantially unloaded and the second signal path being loaded by a known impedance, the present invention contemplates that the characterization circuit may alternatively employ only one signal path. In this embodiment (not shown), switching circuitry (e.g., a mulitplexer, etc.) is preferably included for selectively coupling a known impedance to the signal path of the GUT. The switching circuitry is preferably designed so that the loading on the signal path contributed by the switching circuitry is negligible. Techniques for minimizing the parasitic load will be known by those skilled in the art. When the load impedance is effectively disconnected from the signal path, the unloaded delay measurement DU may be obtained, and when the known load impedance is coupled to the signal path, the loaded delay measurement DL may be obtained. Thus, the delay difference ΔD may be determined as previously described, except in two successive events (e.g., serially) rather than in a parallel manner.

The characterization circuit may be implemented in accordance with at least one processor (not shown) coupled to memory (not shown) for performing the methodologies of the present invention. The processor may be configured to measure the unloaded delay value DU and loaded delay value DL, and to subsequently store one or both of these delay values in memory. In this manner, the delay difference determination may be accomplished, either by the processor or by other means, by subtracting the unloaded delay value from the loaded delay value. Repeated delay measurements may be taken and preferably individually stored for later access and evaluation. If only one signal path is employed, the processor may also be configured to selectively couple a known impedance to the signal path of the GUT, thus incorporating the function of the switching circuitry described above.

Figure 2:
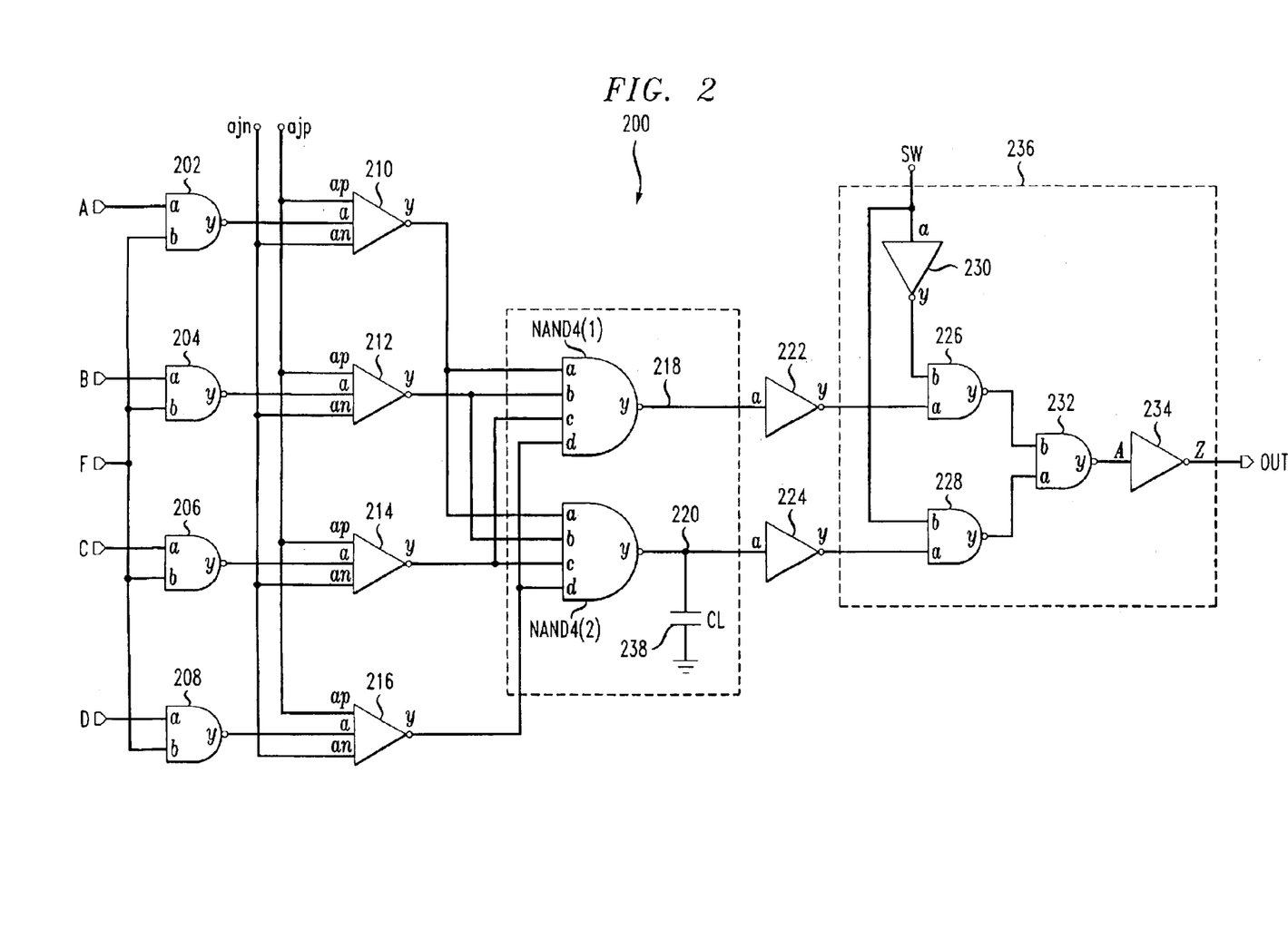
FIG. 2 is a schematic diagram illustrating an exemplary circuit for characterizing a four-input NAND gate under test, in accordance with the present invention.

With reference now to FIG. 2, there is shown a circuit diagram of an exemplary characterization circuit 200 operatively configured for measuring certain performance characteristics of a four-input NAND gate (NAND4), in accordance with the present invention. The exemplary circuit 200 preferably includes five high-speed inputs, A, B, C, D and F, and a high-speed output OUT. The circuit 200 also preferably includes at least one digital control input SW and one or more analog control inputs, ajn and ajp. The control signals presented to control inputs SW, ajn and ajp may be relatively low-speed signals in comparison to the signals presented to inputs A, B, C, D and F. The circuit 200 is also preferably connected to positive and negative voltage supplies (not shown), which may be VDD and ground (GND), respectively, for supplying power to the circuit 200.

The four-input NAND gate, in this instance, is the GUT shown in FIG. 1. As previously explained in conjunction with FIG. 1, the characterization circuit 200 comprises two substantially identical GUTs, namely, NAND4(1) and NAND4(2), associated with an unloaded signal path and a loaded signal path, respectively. An output of NAND4(1) is preferably coupled to an inverter load 222 at node 218, while an output of NAND4(2) is coupled to a capacitive load 238, having a known capacitance CL, and an inverter load 224 at node 220. Outputs of each load inverter 222, 224 are preferably coupled to a multiplexing circuit 236 which selects one of the two signals from inverters 222, 224 as the output signal OUT of the characterization circuit 200 in response to control signal SW.

The multiplexing circuit 236 preferably includes two signal inputs each forming a first input, a, of a corresponding two-input NAND gate 226 and 228. A second input, b, of NAND 228 is coupled to the control signal SW, while second input b of NAND 226 is coupled to a complement of the control signal SW via an inverter 230. The outputs of load inverters 222 and 224 are coupled to the first inputs of NANDs 226 and 228, respectively. When signal SW is a logic low (e.g., zero volts), an output, y, of NAND 228 will be a logic high (e.g., VDD), thus effectively disabling the signal path associated with NAND 228. Since NAND 226 will receive a logic high signal at its second input, an output, y, of NAND 226 will be an inverse of the signal at its first input, from inverter 222. The opposite holds true when the control signal SW is a logic high. Thus, NAND gates 226 and 228 essentially function as pass gates, selectively controlling whether the signal from the corresponding GUT passes through to the output OUT in response to control signal SW. Note, that there are preferably an even number of inverting stages at the outputs of the GUTs. In this manner, a polarity of the outputs from the circuit 200 are preserved.

Each of the four inputs to the GUTs are preferably received via separate signal paths including a corresponding two-input NAND gate 202, 204, 206 and 208. A first input, a, of each NAND 202, 204, 206, 208, is coupled to the corresponding input A, B, C and D, respectively. A second input, b, of each NAND 202, 204, 206, 208, is preferably coupled to common input F, which may be, for example, a clock signal. When input F is a low logic level, each output y of the NANDs 202, 204, 206, 208 will be at a logic high level, regardless of the logic level at inputs A, B, C and D. Thus, input F essentially functions as an enable input for circuit 200. When input F is a high logic level, the output y of each of the NANDs 202, 204, 206, 208 will be the inverse of its corresponding input signal.

In order to preserve the polarity of the input signals to the circuit 200, the output of each NAND 202, 204, 206 and 208 is preferably connected to an input, a, of a corresponding inverter 210, 212, 214 and 216, respectively. An output, y, of each of the inverters 210, 212, 214, 216 is coupled to a corresponding input a, b, c and d, respectively, of the GUTs NAND4(1) and NAND4(2).

As apparent from the figure, each of the inverters 210, 212, 214, 216 immediately preceding the GUTs is preferably a special logic gate having an output slew that is selectively adjustable in response to one or more analog control signals, ajn and ajp, presented to control inputs an and ap, respectively, of the inverters. As will be appreciated by those skilled in the art, an inverter having a controllable slew can be accomplished by adding an NFET device in series with the NFET device in a standard inverter and, likewise, adding a PFET device in series with the standard inverter's PFET device. These additional FET devices are preferably sized to be twice the width of the standard inverter's FET devices and are positioned directly adjacent to ground, in the case of the NFET device, and VDD, in the case of the PFET device. The analog control signals ajn and ajp are applied as inputs to the additional NFET and PFET devices, respectively, to modify the slew of the inverter, and thus selectively control the slews of each of the inputs a, b, c, d to the GUTs.

By setting control signal ajn equal to the positive supply voltage, namely, VDD, and signal ajp equal to the negative supply voltage, namely, GND, each of the inverters 210, 212, 214, 216 functions as a standard inverter with a modestly increased source and drain resistance and having output slews comparable to those of a standard inverter. By decreasing the magnitude of signal ajn from VDD and increasing the magnitude of signal ajp from GND, the output slews of the inverters can be readily increased as desired by up to a factor of about ten. In accordance with the present invention, one can thus use the characterization circuit 200 to study the effect of input slew on the switching resistance Rsw, both pullup (Rsw(PU)) and pulldown (Rsw(PD)), of the GUT. It is to be appreciated that the output slew of the GUTs may also be selectively adjusted, such as, for example, by including one or more additional signal paths and corresponding GUTs (not shown) in parallel, each of the signal paths having a different predetermined value of load impedance associated therewith.

By way of example only, consider a case where inputs A, B, C and F are all held at a logic high level (e.g., VDD) while input D is periodically toggled between a logic low level (e.g., GND) and a high level (e.g., VDD). Since inputs A, B, C and F remain at a high logic level, the outputs of both NAND4(1) and NAND4(2) will periodically undergo pullup and pulldown transitions in response to input D. The state of control signal SW will determine whether the unloaded signal, corresponding to NAND4(1), or the loaded signal, corresponding to NAND4(2), continues through to the output node OUT. In either case, the output signals at node OUT will be substantially identical to each other, except for the delay associated with each. The relative difference in delay $\Delta D$ between the unloaded and loaded signal paths is primarily due to a change in the switching resistance associated with the GUTs multiplied by the load impedance CL (i.e., Rsw×CL) as SW is toggled. Advantageously, in accordance with the present invention, only the time shift between the unloaded and loaded output signals ($\Delta D$) need be measured in order to evaluate the expression Rsw×CL. The exact shape of the waveform need not be measured, since the two waveforms will be substantially identical for both values of SW, assuming there is negligible crosstalk between the inputs and the output of circuit 200. As previously explained, such measurement may be easily determined, with significant precision (e.g., sub-picosecond), using, for example, a conventional sampling oscilloscope.

Since the inputs A, B, C, D and F are preferably individually addressable, all possible combinations of inputs can be exercised in any order. A switching event with simultaneous inputs, for example, can be created by holding inputs A, B, C, and D at a logic high level (e.g., VDD) and then switching input F. By using variable delay lines (e.g., trombones) in the input lines A, B, C, and D, experiments can be performed in conjunction with input F to precisely determine the relative timing of all the inputs. The timing of these inputs can then be precisely adjusted with respect to one another, with input F held at a logic high level.

Any number or combination of switching events, arbitrarily configured with respect to timing and sequence, may precede a given event to be measured. For a conventional bulk technology, one expects the measured switching resistance Rsw of the GUT to be independent of the previous switching history. However, as previously described, for SOI technology, switching history can have a significant impact on the value of Rsw associated with a GUT, with nearly an equivalent impact on the switching delay of the circuit.

By way of example only, consider a simple first switch (1SW)-second switch (2SW) history scenario for a top switching NAND4gate. With continued reference to FIG. 2, inputs B, C, D, and F are preferably all held at VDD. For a 1SW pulldown, the state of circuit 200 is preferably maintained at rest for a predetermined period of time $t_R$, for example, ten milliseconds (ms), with its output at VDD prior to initiating the 1SW pulldown transition by switching input A from a logic low level (e.g., GND) to a logic high level (e.g., VDD). This procedure may be repeated several times with signal SW at both logic low and logic high states to determine the 1SW switching resistance, namely, Rsw(1SW pulldown), as previously described.

Likewise, for a 2SW pulldown, the state of circuit 200 is again maintained at rest for a predetermined period of time, for example, 10 ms, but this time with its output OUT at zero. Input A is then switched from a logic high level (e.g., VDD) to a logic low level (e.g., zero), initiating a 1SW pullup transition in the NAND4. Subsequently, for example, after about 5 nanoseconds (ns), input A is switched from a logic low level to a logic high level, thereby initiating a second switch (2SW) pulldown of the NAND4. In a manner consistent with the 1SW case, this procedure may be repeated several times with signal SW at both logic low and logic high states in order to determine the 2SW switching resistance, Rsw(2SW pulldown), of the GUT. The 1SW–2SW pulldown history may be obtained as a fractional difference between Rsw(1SW pulldown) and Rsw(2SW pulldown). This 1SW–2SW history effect can contribute to a delay variation that is as much as ten percent or more of the total delay and is therefore an important consideration in the characterization and design of SOI circuits.

In addition to the classical 1SW–2SW history scenario described above, the 1SW–2SW history (both pullup and pulldown cases) for any switching configuration of the GUT, for instance, switching induced by inputs A, B, C, D, or any simultaneous combination thereof, with the NAND4, can be measured with the illustrative characterization circuit 200. In addition, as previously stated, any number of switching events, arbitrarily configured with respect to timing and sequence, may precede the particular event to be measured. Thus, the history effect of any SOI circuit in response to an arbitrary switching history can be measured in accordance with the methodologies of the present invention. Consequently, the characterization circuit allows one to investigate specific complex switching situations, such as, for example, in microprocessor paths that may be responsible for anomalously long or short switching delays.

Figure 3A:
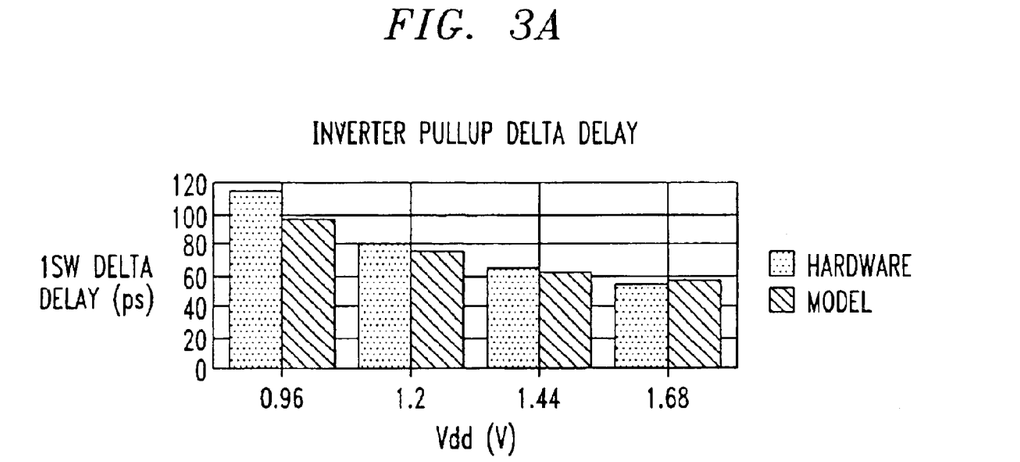
FIG. 3A is a graphical representation illustrating measured and simulated pullup delay for an inverter fabricated using an exemplary 0.13 micron complementary metal-oxide-semiconductor (CMOS) SOI process, in accordance with the present invention.
Figure 3B:
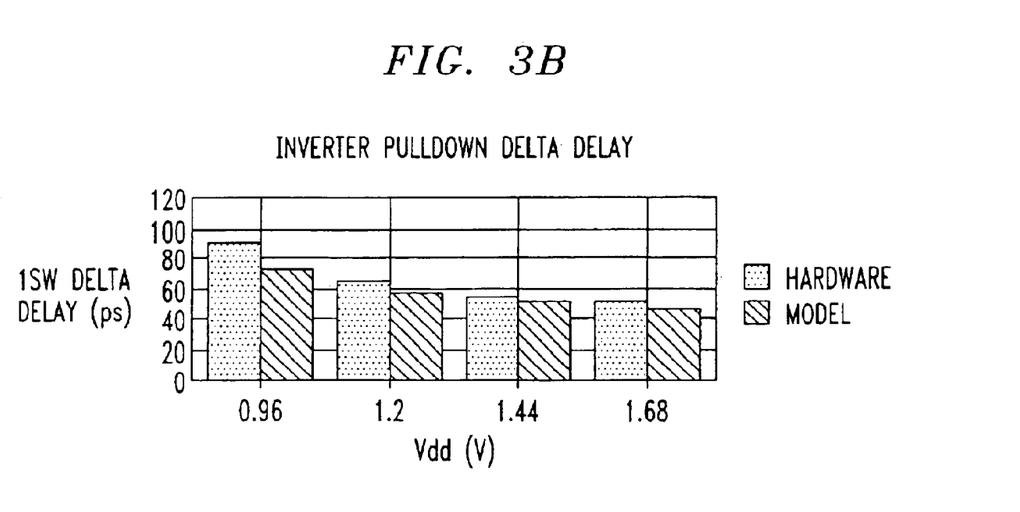
FIG. 3B is a graphical representation illustrating measured and simulated pulldown delay for an inverter fabricated using the 0.13 micron CMOS SOI process, in accordance with the present invention.

FIGS. 3A and 3B illustrate, in graphical representation, measured (Hardware) and simulated (Model) delay as a function of VDD for an inverter (not shown) fabricated using an exemplary 0.13 micron ($\mu$m) CMOS, partially depleted SOI process. The circuit used for obtaining the delay measurements depicted in FIGS. 3A and 3B is preferably consistent with the circuits shown in FIGS. 1 and 2. In this case, the inverter is the GUT and the load capacitance CL is set to be approximately equal to 14 times the input capacitance of a similar inverter. The ratio of the PFET channel width (Wp) to the NFET channel width (Wn) is approximately 1.5. All measurements were made at a temperature of 25 degrees Celsius (° C.). As apparent from the figures, a comparison of FIG. 3A, which represents the PFET device (pullup delay), and FIG. 3B, which represents the NFET device (pulldown delay), indicates the greater strength of the NFET device compared to the PFET device.

Figure 4:
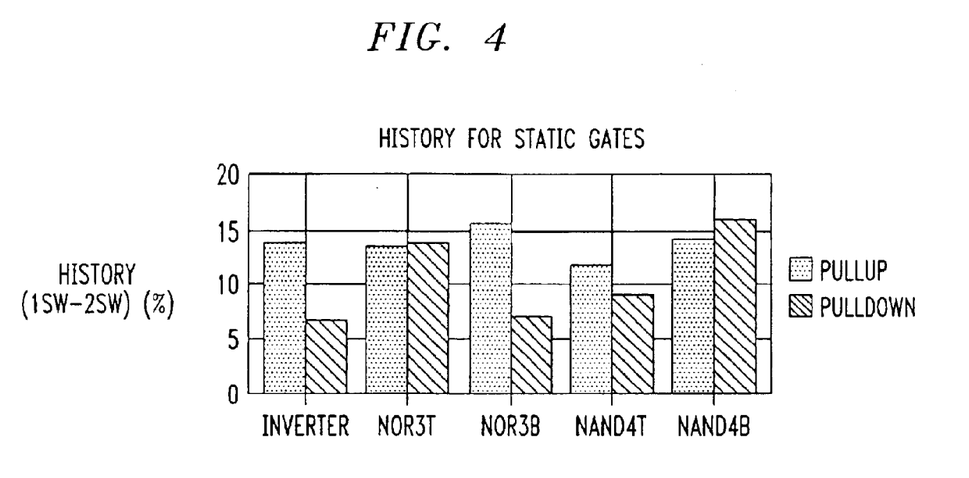
FIG. 4 is a graphical representation illustrating measured pullup and pulldown histories for a set of static gates fabricated using the 0.13 micron CMOS SOI process, in accordance with the present invention.

FIG. 4 illustrates, in graphical representation, measured 1SW–2SW pullup and pulldown histories corresponding to various static gate configurations fabricated using the exemplary sub-0.1 micron ($\mu$m) channel length, partially depleted SOI process described above in connection with FIGS. 3A and 3B. Again, the circuit used for obtaining the delay measurements depicted in FIG. 4 is preferably consistent with the circuits shown in FIGS. 1 and 2. In the figure, NOR3T represents a top-switching three-input NOR gate, NOR3B represents a bottom-switching three-input NOR gate, NAND4T represents a top-switching four-input NAND gate, and NAND4B represents a bottom-switching four-input NAND gate. All measurements were made at VDD equal to 1.2 volts (V) and at a temperature of 25° C. In all of the gates measured, all of the PFET devices had substantially the same Wp and all of the NFET devices had substantially the same Wn. The ratio Wp/Wn for each of the gates is approximately 1.5.

Figure 5:
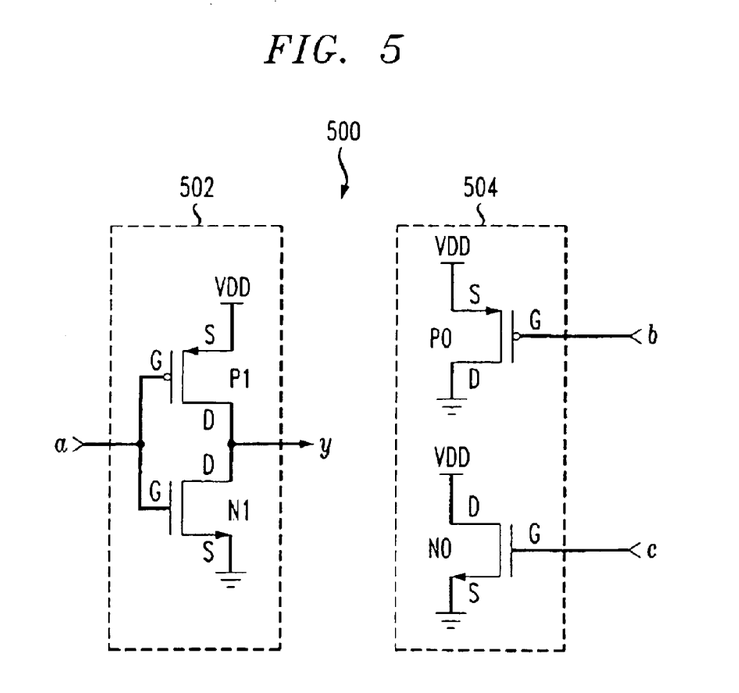
FIG. 5 is a schematic diagram illustrating at least a portion of a circuit for characterizing a thermal relaxation time of a circuit, in accordance with another aspect of the present invention.

In accordance with another aspect of the present invention, FIG. 5 illustrates at least a portion of an exemplary circuit 500 which is configured to measure a thermal relaxation time (from which a thermal time constant may be found) associated with self-heating in a PFET and/or NFET device of the GUT. Circuit 500 may be similar to the characterization circuit 200 of FIG. 2, except with an inverter 502 representing each of the GUTs. The inverter 502 preferably includes a PFET device P1 and an NFET device N1, each device having a source terminal (S), a drain terminal (D) and a gate terminal (G), operatively coupled together in a conventional manner. The circuit 500 also preferably includes a thermal generator 504 for selectively heating the GUT (e.g., inverter 502) in response to one or more control signals presented to the thermal generator 504. Thermal generator 504 preferably includes an NFET device N0 and a PFET device P0. The NFET N0 is preferably configured so that its source terminal (S) is coupled to the negative voltage supply, its drain terminal (D) is coupled to the positive voltage supply, and its gate terminal (G) receives a control signal c. Likewise, PFET P0 is preferably configured so that its source terminal (S) is coupled to the positive voltage supply, its drain terminal (D) is coupled to the negative voltage supply, and its gate terminal (G) receives a control signal b. It is to be appreciated that alternative devices and/or circuit configurations may be used to implement the thermal generator 504, in accordance with the present invention.

NFET N0 and PFET P0 are each preferably located in close relative proximity to the NFET and PFET devices N1 and P1, respectively, of inverter 502. When control signal c is set equal to VDD, or when the magnitude of the gate-to-source voltage ($V_{GS}$) of NFET device N0 is greater than the threshold voltage $V_{TN}$ of the device, NFET N0 will draw current continuously and thus dissipate power. The amount of power dissipation will depend upon the level of the control signal c applied to the device. As the gate voltage is increased, the power dissipation of the device will increase accordingly. This power dissipation will result in an increase in the temperature of device N0 itself, as well as that of the adjacent NFET device N1 in inverter 502. Similarly, when control signal b is set equal to zero, or when the magnitude of the gate-to-source voltage of PFET device P0 is greater than the threshold voltage $V_{TP}$ of the device, PFET P0 will draw current continuously and thus dissipate considerable power. This power dissipation will result in an increase in the temperature of device P0 itself as well as that of the adjacent PFET device P1 in inverter 502.

A difference in delay $\Delta D$ can be measured as a function of time, t, between the turnoff of the self-heated device (controlled by signals b and/or c) and an input, a, to the inverter 502. During relatively short intervals of time t (e.g., less than one nanosecond), inverter 502 will remain at an elevated temperature and will thus exhibit a somewhat longer switching delay. During relatively long intervals of time t (e.g., greater than 10 microseconds), the effects of thermal heating from the thermal generator 504 will have substantially subsided. Thus, by measuring $\Delta D(t)$, it is possible to easily determine the thermal relaxation time associated with the GUT. Powering the self-heating NFET and PFET devices from an independent and variable power supply adds even greater flexibility and control over the region in which the time-dependent thermal behavior of the GUT can be measured.

Test sites including one or more characterization circuits of the present invention described herein are preferably fabricated directly on an individual integrated circuit (IC)

device or wafer, for example, around the periphery of an IC. The test sites may also be formed in unused areas of the IC other than the periphery, so as to avoid consuming valuable IC space.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of determining a characterization parameter of a circuit including at least one input, the method comprising the steps of:
   receiving an input signal presented to the at least one input of the circuit;
   measuring a first delay associated with the circuit when the circuit is substantially unloaded;
   measuring a second delay associated with the circuit when the circuit is loaded by a predetermined impedance;
   determining a difference between the second delay and the first delay, the delay difference corresponding to a switching impedance associated with the circuit; and
   determining the characterization parameter of the circuit based, at least in part, on the switching impedance associated with the circuit.

2. The method of claim 1, wherein the steps of measuring the first delay and second delay include determining a time difference between the input signal presented to the circuit and an output signal generated by the circuit in response thereto.

3. The method of claim 1, wherein the steps of measuring the first delay and second delay are performed substantially concurrently.

4. The method of claim 1, further comprising the step of:
   selectively switching between at least one of a first signal path corresponding to when the circuit is substantially unloaded and a second signal path corresponding to when the circuit is loaded by the predetermined impedance;
   wherein the steps of measuring the first delay and second delay are performed successively with respect to one another.

5. The method of claim 1, further comprising the steps of:
   storing a first value corresponding to the first measured delay; and
   storing a second value corresponding to the second measured delay;
   whereby the step of determining the difference between the second delay and the first delay is performed by determining a difference between the second stored value and the first stored value.

6. The method of claim 1, wherein the step of determining a difference between the first delay and the second delay is performed using a processor.

7. The method of claim 1, wherein the step of determining a difference between the first delay and the second delay is performed using a sampling oscilloscope.

8. The method of claim 1, further comprising the step of selectively adjusting a slew of the input signal presented to the circuit, the characterization parameter being responsive to the slew of the input signal.

9. The method of claim 1, wherein the characterization parameter is at least one of a pullup delay and a pulldown delay associated with the circuit.

10. The method of claim 1, further comprising the step of:
    determining a delay difference as a function of an input switching history associated with the circuit, the input switching history being representative of at least one of a combination of inputs and a plurality of switching events arbitrarily configured with respect to timing and sequence.

11. A method of determining a thermal relaxation time of a circuit, comprising the steps of:
    measuring a first reference delay difference associated with the circuit at a first steady-state temperature, the delay difference corresponding to a difference between a first delay associated with the circuit when the circuit is substantially unloaded and a second delay associated with the circuit when the circuit is loaded by a predetermined impedance;
    heating at least a portion of the circuit for a period of time to establish a thermal steady-state condition of the circuit at a second steady-state temperature, the second steady-state temperature being greater than the first steady-state temperature;
    measuring a second reference delay difference associated with the circuit at the second steady-state temperature; and
    determining an amount of time elapsed after heating has ceased for a measured delay difference associated with the circuit to substantially match the first reference delay difference, the amount of elapsed time corresponding to the thermal relaxation time of the circuit.

12. The method of claim 11, wherein the steps of measuring the first delay and the second delay include determining a time difference between an input signal applied to the circuit and an output signal generated by the circuit in response thereto.

13. The method of claim 11, wherein the step of heating at least a portion of the circuit comprises:
    providing a thermal generator located in close proximity to the at least one device, the thermal generator being configurable to selectively heat the at least a portion of the circuit.

14. The method of claim 13, wherein:
    the thermal generator is powered by a variable power supply; and
    the thermal generator is configured to selectively heat the at least a portion of the circuit in response to a control signal presented to the thermal generator.

15. The method of claim 11, wherein at least one of the delay difference measurements is performed using a sampling oscilloscope.

16. The method of claim 11, wherein the step of determining the elapsed time comprises:
    repeatedly measuring a delay difference associated with the circuit at successively increasing periods of elapsed time after the heating has ceased, until the measured delay difference substantially matches the first reference delay difference.

17. Apparatus for determining a characterization parameter of a circuit including at least one input, the apparatus comprising:
    an interface operatively coupled to the at least one input of the circuit, the interface receiving an input signal presented to the circuit;
    a first signal path operatively coupled to the interface, the first signal path being substantially unloaded and including a first circuit under test, the first circuit under test being substantially identical to the circuit to be characterized; and at least a second signal path operatively coupled to the interface, the second signal path being loaded by a predetermined impedance and including a second circuit under test, the second circuit under test being substantially identical to the circuit to be characterized;

wherein the apparatus is configured to: (i) measure a first delay associated with the first signal path; (ii) measure a second delay associated with the second signal path; (iii) determine a difference between the second delay and the first delay, the delay difference corresponding to a switching impedance associated with the circuit; and (iv) determine the characterization parameter of the circuit based, at least in part, on the switching impedance associated with the circuit.

18. The apparatus of claim 17, wherein the interface comprises slew control circuitry, the slew control circuitry receiving a control signal for selectively controlling the slew of the input signal presented to the circuit to be characterized in response thereto.

19. The apparatus of claim 17, further comprising:

a thermal generator, the thermal generator being in close relative proximity to at least a portion of the circuit to be characterized and selectively controlling a temperature of the at least a portion of the circuit to be characterized;

wherein the apparatus is configured to determine a thermal relaxation time associated with the circuit to be characterized.

20. The apparatus of claim 17, further comprising:

memory for storing a first value corresponding to the first measured delay and a second value corresponding to the second measured delay;

wherein the step of determining the difference between the second delay and the first delay is performed by determining a difference between the second stored value and the first stored value.

21. Apparatus for determining a characterization parameter of a circuit including at least one input, the apparatus comprising:

an interface operatively coupled to the at least one input of the circuit to be characterized, the interface receiving an input signal presented to the circuit;

switching circuitry operatively coupled to the circuit to be characterized, the switching circuitry be configured to selectively couple a predetermined impedance to an output of the circuit to be characterized in response to a control signal; and at least one processor operatively coupled to the switching circuitry and generating the control signal, the at least one processor being operative to: (i) measure a first delay associated with the circuit when the circuit is substantially unloaded; (ii) measure a second delay associated with the circuit when the circuit is loaded by the predetermined impedance; (iii) determine a difference between the second delay and the first delay, the delay difference corresponding to a switching impedance associated with the circuit; and (iv) determine the characterization parameter of the circuit based, at least in part, on the switching impedance associated with the circuit.

22. The apparatus of claim 21, further comprising memory operatively coupled to the at least one processor, wherein the at least one processor is further operative to store the first and second delays in memory.

23. The apparatus of claim 21, wherein the interface comprises slew control circuitry, the slew control circuitry receiving a control signal for selectively controlling the slew of the input signal presented to the circuit to be characterized in response thereto.

24. The apparatus of claim 21, wherein the at least one processor is further operative to determine a delay difference as a function of an input switching history associated with the circuit, the input switching history being representative of at least one of a combination of inputs and a plurality of switching events arbitrarily configured with respect to timing and sequence.

25. Apparatus for determining a thermal relaxation time of a circuit, the apparatus comprising:

an interface operatively coupled to the circuit to be characterized, the interface receiving an input signal presented to the circuit;

a thermal generator, the thermal generator being in close relative proximity to at least a portion of the circuit to be characterized and being configurable for selectively controlling a temperature of the at least a portion of the circuit to be characterized in response to a control signal; and at least one processor coupled to the thermal generator, the at least one processor generating the control signal and being operative to: (i) measure a first reference delay difference associated with the circuit at a first steady-state temperature, the delay difference corresponding to a difference between a first delay associated with the circuit when the circuit is substantially unloaded and a second delay associated with the circuit when the circuit is loaded by a predetermined impedance; (ii) heat at least a portion of the circuit for a period of time to establish a thermal steady-state condition of the circuit at a second steady-state temperature, the second steady-state temperature being greater than the first steady-state temperature; (iii) measure a second reference delay difference associated with the circuit at the second steady-state temperature; and (iv) determine an amount of time elapsed after heating has ceased for a measured delay difference associated with the circuit to substantially match the first reference delay difference, the amount of elapsed time corresponding to the thermal relaxation time of the circuit.

26. The apparatus of claim 25, wherein the at least one processor is further operative to repeatedly measure a delay difference associated with the circuit at successively increasing periods of elapsed time after the heating has ceased, until the measured delay difference substantially matches the first reference delay difference.

* * * * *